(12) United States Patent
Yagi

(10) Patent No.: US 6,713,785 B2
(45) Date of Patent: Mar. 30, 2004

(54) THIN FILM TRANSISTOR AND DISPLAY DEVICE HAVING THE SAME

(75) Inventor: Shigeru Yagi, Minamiashigara (JP)

(73) Assignee: Fuji Xerox Co., Ltd., Tokyo (JP)

(*) Notice: Subject to any disclaimer, the term of this patent is extended or adjusted under 35 U.S.C. 154(b) by 0 days.

(21) Appl. No.: 10/219,500

(22) Filed: Aug. 16, 2002

(65) Prior Publication Data

US 2003/0111663 A1 Jun. 19, 2003

(30) Foreign Application Priority Data

Dec. 13, 2001 (JP) .................................. 2001-379779

(51) Int. Cl.⁷ .............................................. H01L 29/04
(52) U.S. Cl. ...................................................... 257/59
(58) Field of Search ..................................... 257/59, 77

(56) References Cited

U.S. PATENT DOCUMENTS

| | | | |
|---|---|---|---|
| 5,229,644 A | * 7/1993 | Wakai et al. | ................ 257/749 |
| 5,510,631 A | * 4/1996 | Saito et al. | ................... 257/77 |
| 6,310,282 B1 | * 10/2001 | Sakurai et al. | .............. 136/263 |
| 6,355,874 B1 | * 3/2002 | Yagi et al. | ................... 136/252 |

OTHER PUBLICATIONS

Kobayashi, Satoshi; Nonomura, Shuichi; Ohmori, Takashi; Abe, Koichi; Hirata, Satoshi; Uno Takahito; Gotoh, Tamihiro; Nitta, Shoji and Kobayashi, Satoshi, "Optical and electrical properties of amorphous and mirocrystalline GaN films and their application to transparent TFT," Applied Surface Science, 113/114 (1997), 480–484.

Kobayashi, Satoshi; Nonomura, Shuichi; Ushikoshi, Kenichi; Abe, Koichi; Nishio, Motoi; Furukawa, Hideyuki; Gotoh, Tamihiro; Nitta, Shoji, "Optical and electrical properties of nano–crystalline GaN thin films and their application for thin–film transistor," Journal of Crystal Growth, 189/190 (1988) 749–752.

S. Kobayashi et al., "Preparation of Field Effect Transistor Using Nano–Crystalline GaN", Journal of Non–Crystalline Solids 227–230, (1998) 1245–1249.

* cited by examiner

*Primary Examiner*—David Nelms
*Assistant Examiner*—Quoc Hoang
(74) *Attorney, Agent, or Firm*—Oliff & Berridge, PLC

(57) ABSTRACT

A thin film transistor has, on a transparent substrate, a transparent semiconductor layer containing nitrogen, hydrogen and one or more elements selected from Al, Ga and In, a transparent source electrode and a transparent drain electrode at least partially in contact with the transparent semiconductor layer, and a transparent gate electrode.

9 Claims, 4 Drawing Sheets

THIN FILM TRANSISTOR AND DISPLAY DEVICE HAVING THE SAME

BACKGROUND OF THE INVENTION

1. Field of the Invention

This invention relates to a transparent thin film transistor and a display device having the same and, for example, it relates to a thin film transistor capable of coping with higher image quality and higher definition of a display device, as well as a display device using the thin film transistor described above.

2. Description of the Related Art

Higher image quality and higher definition for display devices have been developed rapidly in recent years and there has been a demand for reduction of the size of pixels. Usually in display devices using liquid crystals, a system of using thin film transistors (TFT) and driving them on every pixel has been adopted. For the operation, TFT using amorphous silicon is usually used, and liquid crystals driven by transparent pixel electrodes connected with transistors can be seen through back light. In this case, since amorphous silicon forming the transistor is photo-conductive, it is necessary to shield light so that the light from the back light for the display of liquid crystals is not incident to amorphous silicon for accurate operation only by the voltage, as well as light shielding is necessary for preventing erroneous operation also in a case of utilizing light incidence from the outside as in a reflection type since amorphous silicon is sensitive to visible light, which, however, results in a problem of complicating the steps. Further, since amorphous silicon has absorption for visible light, it is impossible to adapt a structure in which light is transmitted through the TFT portion.

The size of the pixel is determined depending on the size of a pixel electrode and the size of TFT to drive the same and it is necessary to reduce the size of the pixel in order to attain higher image quality and higher definition. However, when the size of the pixel is reduced, an area ratio (open ratio) between a pixel-forming TFT portion not transmitting light and a pixel electrode capable of transmitting light and driving liquid crystals is decreased to result in a problem of lowering the light transmittance and darkening the display, and also increasing electric power consumption.

Further, since the pixel itself depends on the area of the pixel electrode excluding the opaque TFT, it results in a problem of reducing the size of the pixel.

In view of the problems described above, a proposal has been made for the possibility of a transparent TFT using amorphous GaN and microcrystalline GaN (S. Kobayashi, et al. Applied Surface Science, 113/114 (1997) 480 to 484). In this report, a structure of using n-type crystalline Si as a substrate and gate electrode, and $SiO_2$ as an insulative layer, and disposing a source-drain electrodes of an Al vacuum deposition film on microcrystalline GaN is used. In the device structure, while the semiconductor layer is transparent, TFT itself is not transparent. Further, although a structure of using a glass substrate has also been proposed (J. Cryst, Growth 189/190 (1998) 749 to 752), since it uses the source-drain electrodes of an Al film and the Al gate electrode, and it cannot be used for a transparent device.

SUMMARY OF THE INVENTION

This invention at intends to overcome the foregoing problems in the related art and provides a thin film transistor which is transparent and capable of transmitting light.

This invention provides a thin film transistor capable of obtaining a bright display device which has fewer light untransmissive portions in the pixel unit, capable of reducing the size of the pixel unit to the limit size of the transistor, manufactured by simple manufacturing steps, bright and with less power consumption, as well as a display device having such a thin film transistor.

The thin film transistor of this invention includes, on a transparent substrate, a transparent semiconductor layer containing nitrogen, hydrogen and one or more elements selected from Al, Ga and In, a transparent source electrode and a transparent drain electrode at least partially in contact with the transparent semiconductor layer, and a transparent gate electrode.

The thin film transistor according to this invention has, as the semiconductor layer, a semiconductor layer containing nitrogen, hydrogen and one or more elements selected from Al, Ga and In, and, since the substrate, the semiconductor layer and each of the electrodes are transparent, the transistor itself can transmit light. Particularly, in a case of utilizing the transistor for the display device, the pixel unit has fewer light untransmissive portions, the size of the pixel unit can be reduced to the limit size of the transistor and it can cope with higher image quality and higher definition of the display device. Further, since the semiconductor layer described above has no absorption for visible light and there is no requirement of separately providing a shielding member, manufacturing steps are simple. Since the transistor itself transmits light and this can eliminate the problem of the area ratio between the TFT portion and the pixel electrode (opening ratio), bright and less-power-consuming display device can be obtained. Further, the degree of freedom for the positioning of pixel electrodes is also enhanced.

BRIEF DESCRIPTION OF ACCOMPANYING DRAWINGS

Preferred embodiments of this invention will be described in details based on the followings, wherein.

Figure 5:
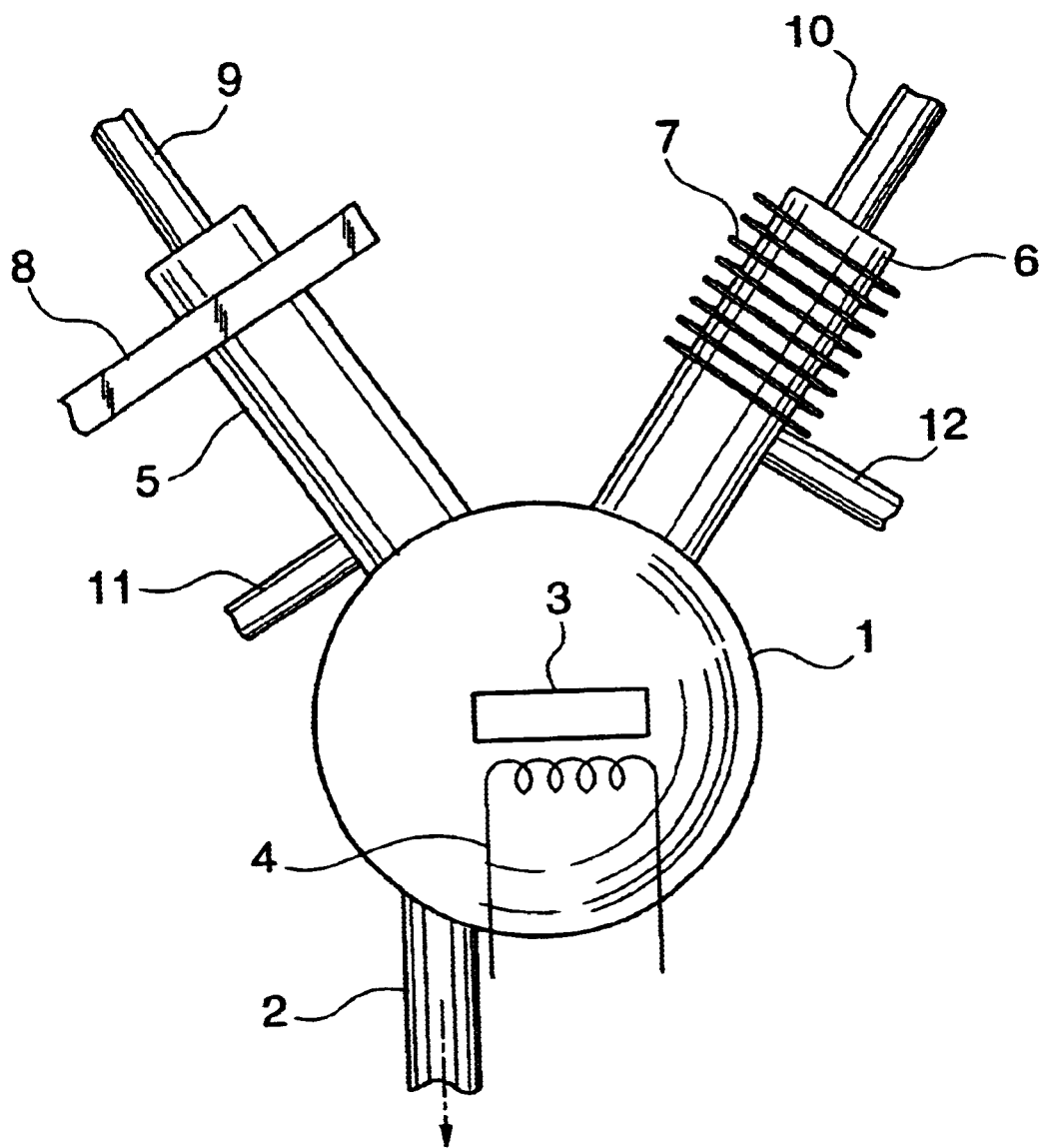
Figure 6:
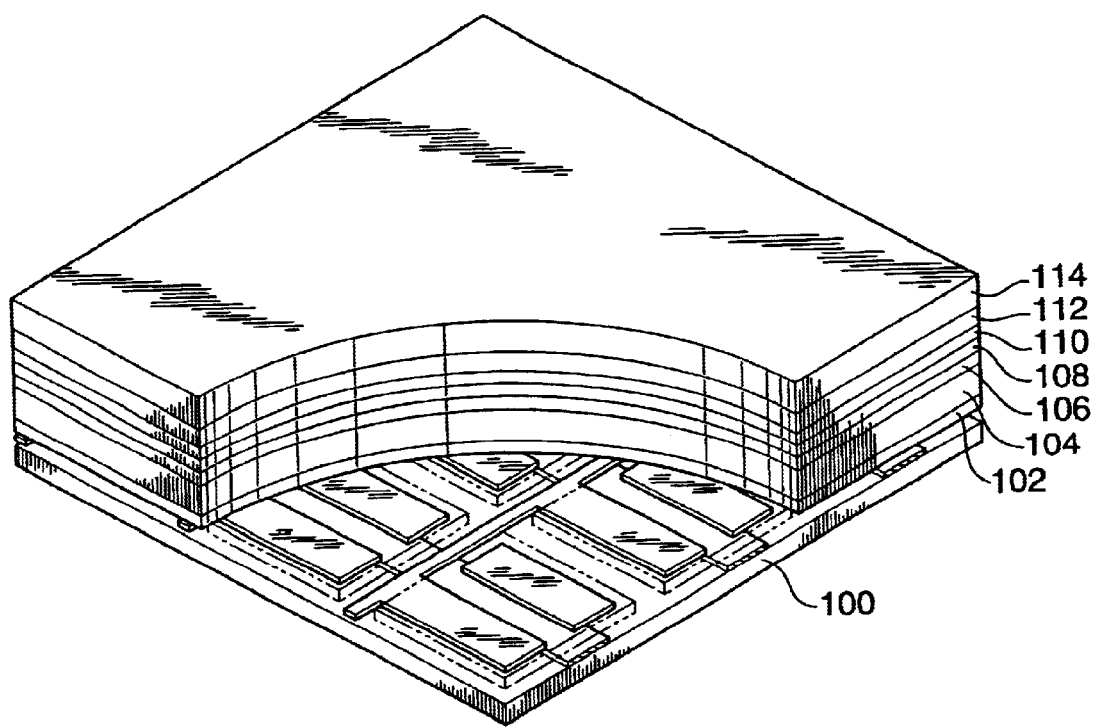

FIG. 5 is a schematic constitutional view showing an example of a film formation apparatus for forming a transparent semiconductor layer of a thin film transistor as the first and second embodiments according to this invention; and FIG. 6 is a perspective constitutional view showing an example of a display device (display device of the invention) having a thin film transistor according to this invention.

PREFERRED EMBODIMENTS OF THE INVENTION

Preferred embodiments of this invention are to be described with reference to the drawings. Those having substantially identical functions carry the same reference numerals throughout the drawings and explanations therefor may be omitted. In this invention, the term "transparent" means transparent or semitransparent to visible light substantially having transmittance to visible light of 20% or more.

First Embodiment

Figure 1:
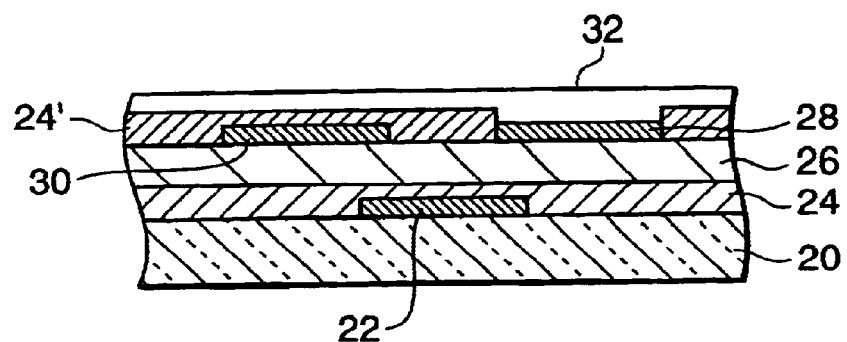
FIG. 1 is a schematic cross-sectional view showing a thin film transistor as a first embodiment according to this invention.

FIG. 1 is a schematic cross-sectional view of a thin film transistor as a first embodiment according to this invention. The thin film transistor of the first embodiment is an inverted stagger type thin film transistor having a constitution including, as shown in FIG. 1, a transparent substrate 20, a transparent gate electrode 22 disposed on the transparent substrate 20, a transparent insulative layer 24 disposed so as to cover the transparent gate electrode 22, a transparent semiconductor layer 26 disposed on the transparent insulative layer 24, a transparent source electrode 28 and a transparent drain electrode 30 disposed on the transparent semiconductor layer 26, a transparent insulative layer 24' disposed so as to cover the transparent drain electrode 30, a transparent pixel electrode 32 covering the transparent insulative layer 24' and in connection with the transparent source electrode 28.

Figure 2:
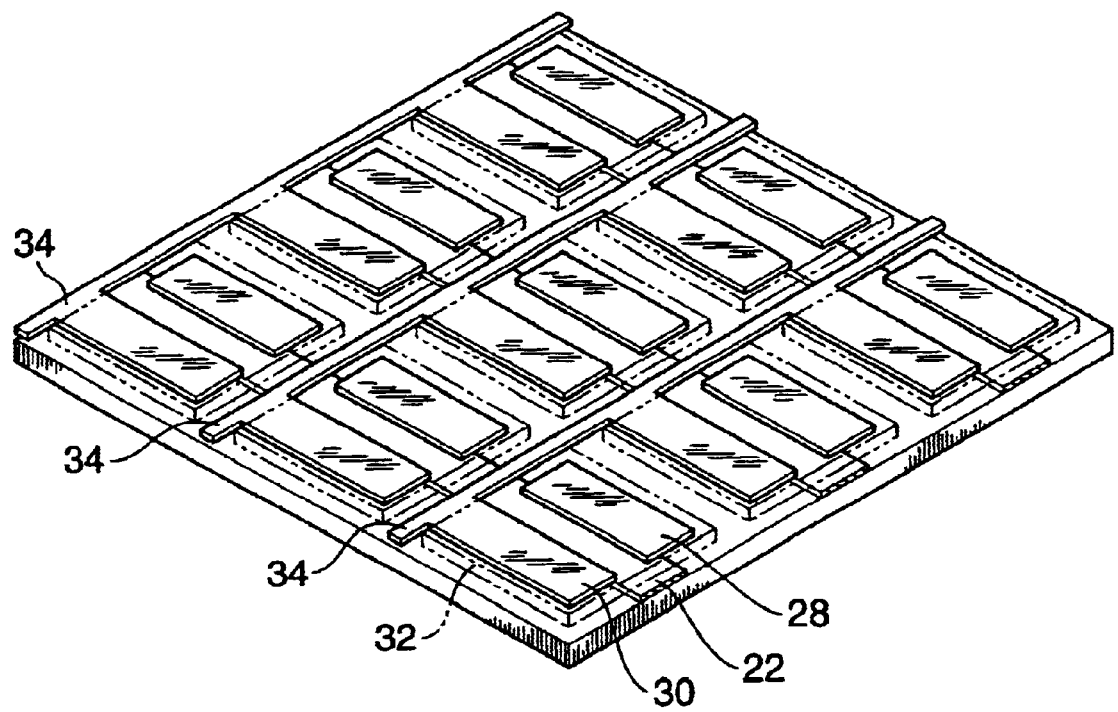
FIG. 2 is a schematic perspective view showing the thin film transistor as the first embodiment according to this invention.

In the thin film transistor of the first embodiment, as shown in FIG. 2, the transparent pixel electrode 32 is disposed by way of the transparent source electrode 28 and the transparent drain electrode 30 (transparent insulative layers 24, 24' and transparent semiconductor layer 26 are not illustrated) on the transparent gate electrode 22. In the drawing, 34 denotes source electrode wiring. Further, the transparent gate electrode 22 is formed in a stripe pattern and serves also as gate electrode wiring.

The thin film transistor of the first embodiment has a semiconductor layer containing one or more elements selected from Al, Ga and In, nitrogen and hydrogen as will be described later and the substrate, each of the layers, and each of the electrodes are transparent. Further, this is disposed on the gate electrode by way of each of the layers and electrodes (transparent source electrode and transparent electrode, transparent insulative layer, transparent semiconductor layer). Accordingly, the transistor itself can transmit light and, when utilized for the display device, the pixel unit has fewer light untransmissive portions and the size of the pixel unit can be reduced to the limit size of the transistor, so that it can cope with higher image quality and higher definition of the display device. Further, since the specified semiconductor layer has no absorption to the visible light and there is no requirement of separately providing a light shielding member, manufacturing steps are simple. Further, since the transistor itself transmits light, this can eliminate the problem of the area ratio (opening ratio) between the TFT portion and the pixel electrode and, accordingly, a bright display device with less power consumption can be obtained.

Second Embodiment

Figure 3:
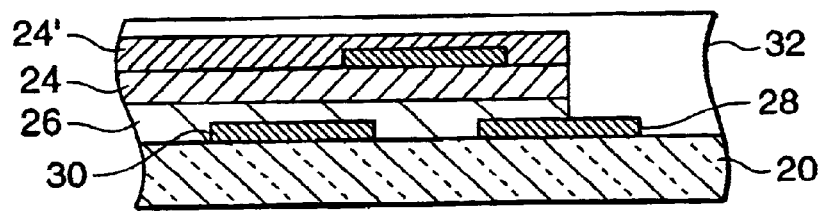
FIG. 3 is a schematic cross-sectional view showing a thin film transistor as a second embodiment according to this invention.

FIG. 3 is a schematic cross-sectional view of a thin film transistor as a second embodiment according to this invention. The thin film transistor of the second embodiment is a stagger type thin film transistor having a constitution including a transparent substrate 20, a transparent source electrode 28 and a transparent drain electrode 30 disposed on the transparent substrate 20, a transparent semiconductor layer 26 disposed so as to cover the transparent drain electrode 30 entirely and the transparent source electrode 28 partially, a transparent insulative layer 24 disposed on the transparent semiconductor layer 26, a transparent gate electrode 22 disposed on the transparent insulative layer 24, a transparent insulative layer 24' so as to cover the transparent gate electrode 22, and a transparent pixel electrode 32 so as to cover the transparent insulative layer 24' and in contact with the transparent source electrode 28.

Figure 4:
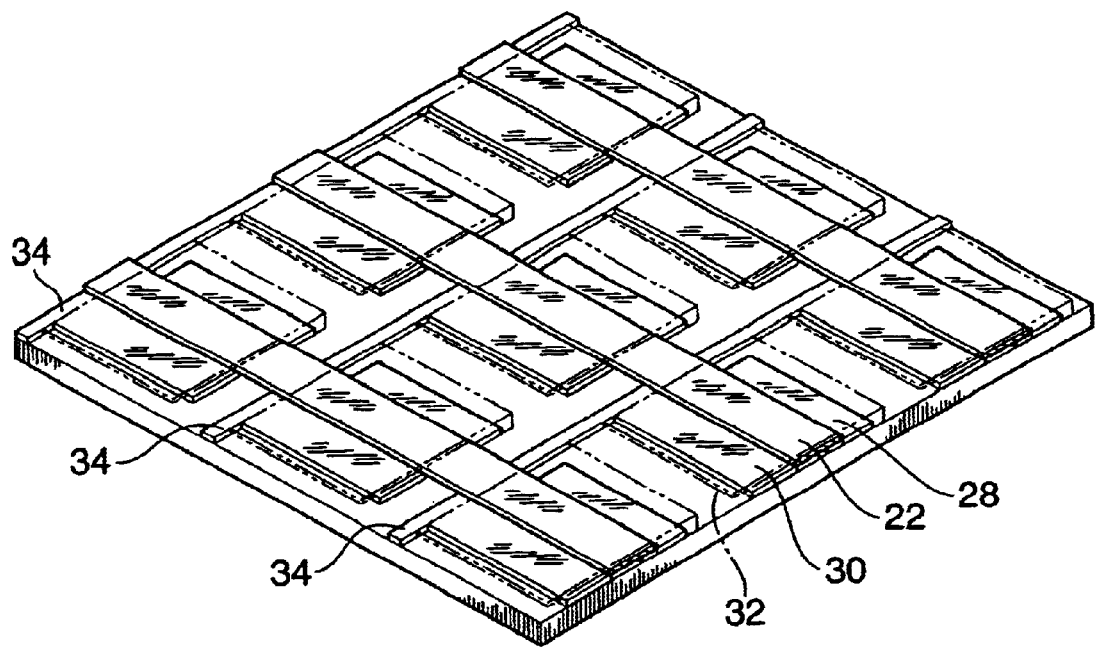
FIG. 4 is a schematic perspective view showing the thin film transistor as the second embodiment according to this invention.

As shown in FIG. 4, in the thin film transistor of second embodiment, the transparent pixel electrode 32 is disposed by way of the transparent insulative layer 24' (not illustrated) on the transparent gate electrode 22. In the drawing, 34 denotes source electrode wiring. Further, the transparent gate electrode 22 is disposed in a stripe pattern, and also serves as gate electrode wiring.

In the thin film transistor of the second embodiment, like the first embodiment of the inversed stagger type, the type transistor itself can also transmit light and cope with the higher image quality and higher definition of the display device. Further, a bright display device with less power consumption with simple manufacturing steps can be obtained.

Details for each of the members in the thin film transistors in the first and second embodiments will be explained. The members are explained with no reference numerals.

Transparent Substrate 20

The transparent substrate may be insulative or conductive and may be crystalline or amorphous. In a case where a conductive substrate is used as the transparent substrate, it is patterned with a transparent insulative material. A preferred transparent substrate can be formed of, for example, those made of transparent inorganic materials such as glass, quartz, sapphire, MgO, SiC, ZnO, LiF and $CaF_2$, films of transparent organic resin (polymeric film) or a plate-like body made of fluoro resin, polyester, polycarbonate, polyethylene, polyethylene terephthalate and epoxy. Further, a colored transparent substrate may also be used.

Transparent Electrodes (Transparent Gate Electrode 22, Transparent Source Electrode 28, Transparent Source Electrode 30, Transparent Pixel Electrode 32)

The transparent electrodes disposed on the substrate (transparent gate electrode 22 in the first embodiment, transparent source electrode 28 and transparent source electrode 30 in second embodiment) usable herein can include, preferably, those made of transparent conductive materials such as ITO, zinc oxide, tin oxide, lead oxide, indium oxide and copper iodide formed by vacuum deposition, ion plating or sputtering, or those made of metals such as Al, Ni and Au formed into reduced film thickness and made transparent by vacuum deposition or sputtering.

As the transparent electrode disposed on the transparent semiconductor layer (source electrode 28, transparent drain electrode in the first embodiment, transparent gate electrode 22 in the second embodiment), those formed of the transparent conductive materials described above can be used including, preferably, those made of metals such as Al, Ni, Au, Ni, Co and Ag and formed by vacuum deposition or sputtering into reduced thickness so as to allow the light to transmit. Further, the same materials are also used suitably to the transparent pixel electrode.

The thickness of the transparent electrode is preferably from 5 nm to 100 nm. When the thickness is insufficient, the transmittance is high but the electric resistance tends to be increased. When the thickness is excessive, the light does not tend to transmit, so that the range described above is suitable.

Transparent Insulative Layers 24, 24'

As the transparent insulative layer, nitrogen compound semiconductor layers are suitable which are transparent and have high dark resistance and a large wide band gap in which dangling bonds are inactivated by hydrogen to form stable electric fields by the gate voltage with entry and trapping of electric charges from the gate electrode.

The nitride compound semiconductor layer can include, preferably, a semiconductor layer containing one or more elements selected from Al, Ga, and In, nitrogen and 0.5 atomic % or more and 50 atomic % or less of hydrogen. Specifically, the semiconductor layer can include, for example, $Al_xGa_{(1-x)}N:H(x=0$ to 1), and $Al_xGa_{(1-x)}N:H(x=0$ to 1) doped with one or more elements selected from Be, Mg, Ca, C, Si, Ge, Pb for high resistance control. The semiconductor layer may have a photoconductivity but it is preferred not to have sensitivity to UV-rays at a wavelength incident to TFT. Another preferred embodiment in this semiconductor layer is identical with the transparent semiconductor layer to be described later.

Further, the transparent insulative layer can also include, preferably, amorphous silicon nitride (hydrogenated silicon nitride) or silicon oxide or silicon carbide.

Transparent Semiconductor Layer 26

The transparent semiconductor layer is a transparent semiconductor layer containing one or more elements selected from Al, Ga, In, nitrogen and hydrogen. The transparent semiconductor layer may be single crystalline or non-single crystalline. In this text, "non-single crystalline state" means a state having only the amorphous phase, a state having only the microcrystalline phase or a mixed state of the two. The crystal system in the crystal phase may be either one of tetragonal and hexagonal systems, or may be in a state where plural crystal systems are mixed. The size of the microcrystals is preferably about 5 nm to 5 $\mu$m, which can be measured by X-ray diffractiometry, electron diffractiometry and shape measurement by use of a cross-sectional electron microscopic photography. Further, the crystal structures of the transparent semiconductor layer may be those in which crystals are grown into a columnar shape, or those in which specified crystal phase and/or crystallographic axis are highly oriented in which only the peaks for the specified crystal phase and/or crystallographic axis (peaks) are remarkably observed by X-ray diffraction spectroscopy or it may be of single crystals.

The transparent semiconductor layer can include, for example, those of obscure halo pattern with no ring-like diffraction pattern at all completely lacking in the long range order in transmission electron diffraction pattern, those in which ring-like diffraction pattern is observed in the halo pattern and, further, those in which bright spots were observed. In such a film (layer), peaks are often scarcely obtained in the X-ray diffractiometry that measures a wider range than the transmission electron diffractiometry. Further, they also include those in which a number of bright spots are observed together with the ring-like diffraction pattern in the transmission electron diffraction pattern and those formed of almost only the bright spots in which peaks of polycrystals or peaks with the highest peak intensity being weak compared with single crystals in the X-ray diffractiometry and other weak peaks of other face orientation are mixed together. Further, they also include those showing X-ray diffraction spectra formed of almost one phase orientation. Furthermore, they often include those in which bonding peaks with hydrogen are present in the IR absorption spectra and in which the half-width of the oscillation absorption peak for the bonding between the group IIIa atom and N atom is 150 cm$^{-1}$ or more in a case where it is mainly formed of an amorphous structure and the half value is 100 cm$^{-1}$ or less in a case where it is mainly formed of a microcrystalline structure. The half width means a width at the ½ height for the intensity in the absorption band formed of plural peaks for absorption mainly of bondings between IIIa group atom and N atom, excluding the highest intensity and the background.

The transparent semiconductor layer contains hydrogen and the hydrogen concentration is preferably within a range from 0.5 atomic % to 50 atomic %. Further, the transparent semiconductor layer may also contain 1-coordinate halogen atom (F, Cl, Br, I).

When the hydrogen concentration is less than 0.5 atomic %, it is insufficient to eliminate bonding defects at the crystal grain boundary, bonding defects inside the amorphous phase or unbonded sites with bonding with hydrogen thereby inactivating defect energy level formed in the band, so that the bonding defects or the structural defects increase to lower the dark resistance and the layer can not function satisfactorily.

On the other hand, when the hydrogen concentration exceeds 50 atomic %, the current transportation is lowered to sometimes deteriorate the electrical characteristics as well as mechanical property such as hardness.

The hydrogen concentration can be measured for the absolute value by hydrogen forward scattering (HFS). Further, the relative value can be estimated by the measurement for the amount of hydrogen released by heating, or by the measurement of the IR absorption spectral intensity concerned with the bonding state of hydrogen. Further, the bonding state of hydrogen contained in the transparent semiconductor layer can be measured easily by IR absorption spectroscopy.

In a case where the thin film transistor is utilized, for example, for a display device, it is preferred that the transparent semiconductor layer has a band gap (optical gap) of 3.5 eV or more when light up to about 300 nm such as light from fluorescent lamp transmits, although it depends on the wave length band for light transmission in the material for liquid crystal, polarization plate, transparent electrode or the substrate used on the side of the display surface.

The band gap (optical gap) can be changed optionally by the mixing ratio of the group IIIa element. For example, when GaN:H having a band gap of 3.2 to 3.5 eV is used as a base composition, the band gap can be increased up to about 6.5 eV by adding Al to the composition.

In the transparent semiconductor layer, since electrons are conducted through the channel between the source and drain opened by the gate electrode, the layer is preferably of i-type, weak n-type or n-type from a viewpoint of improving the electric characteristic. Particularly, for decreasing the dark current when gate voltage is not applied, an i-type or weak n-type is preferred. Specifically, i-type can be formed, for example, by doping a group IIa element such as Be, Mg or Ca (group No. 16 according to IUPAC, Nomenclature of Inorganic Chemistry, 1989 revised edition) in a trace amount. Further, the weak n-type or n-type can be formed by not applying doping or doping group IVa element such as C, Si, Ge and Pb (group No. 2 according to IUPAC, Nomenclature of Inorganic Chemistry, 1989 revised edition) as a dopant. Particularly, in this invention, the transparent semiconductor layer is preferably doped (incorporated) with one or more elements selected from Be, Mg, Ca, C, Si, Ge and Pb and the existence ratio of the group IIa element and the group IVa element may preferably changed properly.

In the region of the transparent semiconductor layer in contact with the transparent source electrode and the transparent drain electrode, it is preferred to dope (incorporate) one or more elements selected from C, Si, Ge and Pb thereby forming only the region as n-type or n$^+$-layer from a viewpoint of improving the electric characteristic. Further, the region may be formed by inserting a (dope) layer containing one or more elements selected from C, Si, Ge and Pb (laminated constitution).

The transparent semiconductor layer can be prepared, for example, by the following procedure. A description will be made in conjunction with the drawings but the invention is not restricted only thereto. Hereinafter, the transparent semiconductor layer is sometimes referred to as "nitride semiconductor film".

At first, FIG. 5 is an example of a film formation apparatus for forming a transparent semiconductor layer which is an apparatus using plasmas as activation unit. In the drawing, are shown a film formation chamber 1, an exhaustion port 2, a substrate holder 3, a heater 4 for heating the substrate, quartz tubes 5, 6 connected to the film formation chamber 1, which are in communication with gas introduction tubes 9, 10 respectively. The exhaustion port 2 is connected with an unillustrated vacuum pump (rotary pump and mechanical booster pump). The quartz tube 5 is connected with a gas introduction tube 11 while the quartz tube 6 is connected with a gas introduction tube 12. Further, a diaphragm type vacuum gage (not illustrated) and a radiation thermo meter (not illustrated) opposed to the substrate holder 3 are attached in the film formation chamber 1.

Radio-frequency wave coils 7 connected with a radio-frequency oscillator (not illustrated) are wound around the outer periphery of the quartz tube 6 to constitute an induction coupling type plasma generation device, while a microwave guide wave tube 8 connected with a microwave oscillator (not illustrated) is connected to the quartz tube 6 to constitute an ECR plasma generation device. As described above, the film formation apparatus shown in FIG. 5 is a plasma CVD (Chemical Vapor Deposition) apparatus in which the two plasma generation device described above are connected to the film formation chamber 1.

However, film formation for the transparent semiconductor layer is not restricted to the constitution of the film formation apparatus shown in FIG. 5 but it may have plural film formation chambers or it may be a film formation apparatus other than the CVD apparatus such as a PVD (Physical Vapor Deposition) apparatus like, for example, a magnetron sputtering apparatus.

Then, the method of forming a transparent semiconductor layer by using the film formation apparatus shown in FIG. 5 will be explained.

For forming a nitride semiconductor film on the surface of the substrate disposed on the substrate holder 3 in the evacuated film formation chamber 1, various types of gases are introduced and discharged as described below. At first, an $N_2$ gas is introduced as a nitrogen element source from the gas introduction tube 9 to the quartz tube 5. Microwaves at 2.45 GHz are supplied to the microwave guide tube 8 connected with the microwave oscillator (not illustrated) using a magnetron to cause electric discharging in the quartz tube 5. Further, for example, an $H_2$ gas is introduced from the gas introduction tube 10 into the quartz tube 6. Further, radio waves at 13.56 MHz are supplied from a radio-frequency oscillator (not illustrated) to the radio-frequency coils 7 to generate electric discharging in the quartz tube 6. In this state, when trimethyl gallium is introduced from the gas introduction tube 12 to the discharging space on the side of the film formation chamber 1, an amorphous or microcrystalline unsingle crystal nitride semiconductor film can be formed on the substrate.

The film structure of the photosemiconductor (amorphous, microcrystal, polycrystal highly oriented to specified crystallographic axis/crystal face and grown to a columnar shape, single crystal) is controlled by the kind of the substrate, the substrate temperature, flow rate/pressure of gas and discharging condition. The substrate temperature is controlled in a range from 100° C. to 600° C. When the substrate temperature is 200° C. or higher and/or the flow rate of the starting material gas of the group IIIa element is small, the film structure tends to be in a microcrystalline or single crystalline state. In a case where the substrate temperature is lower than 200° C. and the flow rate of the starting material gas of the group IIIa element is small, the film structure tends to be crystalline.

Also in a case where the substrate temperature is higher than 300° C. and the flow rate of the starting material gas for the group IIIa element is large, the film structure tends to be crystalline. Further, in a case of forming a film with addition of a hydrogen gas excited into a plasma state to the starting material gas of the group IIIa element, crystallinity of the film can be further enhanced.

As the starting material gas of the group IIIa element, trimethyl gallium (TMGa) may be used for instance but an organic metal compound containing indium or aluminum may be used instead of TMGa, or a mixture of them may also be used. Further, TMGa and the organic metal compound may be introduced simultaneously from the gas introduction tube 11.

An amorphous or microcrystalline nitride semiconductor film of optional conductivity of n-type or p-type can be formed on a surface of the substrate by introducing a gas containing at least one of elements selected from C, Si, Ge, Sn and Pb, a gas containing at least one of elements selected from Be, Mg, Ca, Zn and Sr, or a gas containing one or more of them into the discharging space on the side of the film formation chamber 1 (gas introduction tube 11 or gas introduction tube 12). In the case of C, carbon of the organic metal compound used as the starting material of the group IIIa element may also be used depending on the film forming condition.

In the apparatus described above, the active nitrogen or active hydrogen formed by the discharging energy can be controlled independently, or a gas containing nitrogen and hydrogen atoms together such as $NH_3$ may also be used. Further, $H_2$ may also be added. Further, a condition of liberating to form active hydrogen from an organic metal compound may also be adopted. With the procedures described above, since activated group III atoms and nitrogen atoms are present under the controlled state on the conductive substrate and the hydrogen atoms turn methyl groups or ethyl groups into inactive molecules such as methane or ethane, amorphous or microcrystalline films with no excessive incorporation of carbon in the nitride semiconductor film and with restrained film defects can be formed despite a low temperature.

In the film formation apparatus in FIG. 5, a known plasma generation apparatus can be used as the activation unit for hydrogen and nitrogen or the group IIIa element, which may be a radio-frequency oscillator, a microwave oscillator or a radio-frequency wave oscillator of an electro cyclotron resonance system or a helicon plasma system, which may be used alone or two or more of them may be used. Further, both of the two units may be microwave oscillators or both of the two units may be radio-frequency oscillators. In the case of the radio-frequency discharging, it may be an induction type or a capacitance type. Furthermore, the electro cyclotron resonance system may be used for both of the two units. In a case of using different activation units (excitation units), it is necessary that electric discharging can be generated simultaneously under an identical pressure, and a pressure difference may be set between the discharging portion and the film formation portion. Further, in a case of conducting activation under an identical pressure, when different activation units (excitation units), for example, the microwave oscillator and the radio-frequency oscillator are used, the excitation energy for excited species can be changed greatly, which is effective for the control of the film quality.

Further, the nitride semiconductor film can be formed also in an atmosphere in which at least hydrogen is activated by reactive vacuum deposition, ion plating or reactor sputtering.

As the starting material for the group IIIa element, an organic metal compound containing one or more elements selected from Al, Ga and In can be used.

The organic metal compound can include, for example, trimethyl aluminum, triethyl aluminum, tertiary butyl aluminum, trimethyl gallium, triethyl gallium, tertiary butyl gallium, trimethyl indium, triethyl indium, and tertiary butyl indium in the form of liquid or solid which is evaporated and can be used solely or in a mixed state by bubbling with a carrier gas. As the carrier gas, hydrogen, nitrogen, hydrocarbons such as methane or ethane and halogenated carbons such as $CF_4$ and $C_2F_6$ can be used.

As the nitrogen material, $N_2$, $NH_3$, $NF_3$, $N_2H_4$ or methyl hydrazine can be used in the form of a gas or liquid by evaporating or bubbling the same with a carrier gas.

A dopant may further be doped to the nitride semiconductor film constituting the transparent semiconductor layer formed by the film formation method as described above by means of a known method such as thermal diffusion or ion implantation. Further, the transparent semiconductor layer may have a multi-layered film structure.

In the Embodiments 1 and 2 described above, the transparent gate electrode is formed into a stripe pattern and serves also as the gate electrode wiring as shown in FIGS. 2, 4. However, the transparent gate electrode may be formed on every pixel unit in the display device and gate electrode wiring may be formed separately. Further, since the gate electrode wiring or the source electrode wiring may be required also for distinguishing the pixels from each other in the display device, they may be also formed of an opaque conductive material such as a metal.

It will be apparent that the first and the second embodiments described above are not construed limitatively and can be attained within a range satisfying the constituent factors of this invention.

The thin film transistor according to this invention as described above is appropriately utilizable to known technical fields form a viewpoint of utilizing the background illumination or attainment of transparent display devices, and it is utilizable suitably to those display devices using liquid crystal material, electrophoretic material, swelling-contraction type polymeric gel material, electrochromic material, luminescence material (for example, electro luminescence material (electric field photo-emission material), photo-luminescence material (UV-ray emission material) cursor luminescence material (electron beam photo-emission material), etc.). Particularly, it is suitably utilizable for the transmission type display device.

FIG. 6 schematically shows an example of a liquid crystal display device having a thin film transistor (TFT) of this invention. In the drawing are shown a TFT 100 (thin film transistor of the invention), a polyimide orientation film 102, liquid crystals 104, a polyimide orientation film 106, a conductive film (ITO) 108, a protection film 110, a color filter layer 112, and a glass substrate 114, respectively. In the case of a transmission type, back light may be disposed to the rear face of the TFT 100 (surface opposite to the surface on which the polyimide orientation film 102 is disposed).

The thin film transistor according to this invention preferably has a transparent pixel electrode by way of an optional layer and/or electrode on the gate electrode. When the transparent pixel electrode is disposed on the gate electrode, the size of the transistor itself can be made as a size of the pixel unit in the display device and the size of the pixel unit in the display device can be reduced preferably to the limit size of the transistor.

In the thin film transistor according to this invention, it is preferred that the transparent semiconductor layer further contains one or more elements selected from Be, Mg, Ca, C, Si, Ge and Pb from a viewpoint of improvement for the electric characteristic. Further, it is preferred that the transparent semiconductor layer further contains one or more elements selected from C, Si, Ge and Pb in a region in contact with the transparent source electrode and the transparent drain electrode.

The thin film transistor according to this invention preferably has a transparent insulative layer disposed between the transparent gate electrode and the transparent semiconductor layer, and the transparent insulative layer is a semiconductor layer containing one or more elements selected from Al, Ga and In, nitrogen and 0.5 atomic % or more and 50 atomic % or less of hydrogen, amorphous silicon nitride or silicon oxide.

The display device according to this invention has a thin film transistor of the invention.

EXAMPLE

This invention is to be explained further concretely with reference to examples. However, this invention is not restrict to such examples.

Example 1

ITO was formed as film of 2 mm both in width and length and 200 nm in thickness by sputtering on cleaned Corning 7059 to form a transparent gate electrode. Insulative amorphous AlGaN:H was formed to a film of 200 nm in thickness so as to cover the gate electrode while leaving one end to form a transparent insulative film. An undoped GaN:H film was formed on the transparent insulative layer to form a transparent semiconductor layer. ITO was formed as two films each of 200 $\mu$m both in width and length and 100 nm in thickness at a gap distance of 50 $\mu$m (by two) on the transparent substrate layer to form a transparent source electrode and a transparent drain electrode. Thus a transparent device was manufactured.

When a voltage at 5 V was applied between the transparent source electrode and the transparent drain electrode in this device, 0.5 to 1 $\mu$A of a current was obtained at gate voltage of 10 V on the gate electrode, and it could be confirmed that the device operated as a transparent inverted stagger type TFT.

Further, after forming a film of insulative amorphous AlGaN:H to a thickness of 100 nm so as to cover the transparent drain electrode to obtain a transparent insulative layer, ITO was formed as a film so as to cover the transparent insulative layer and the transparent source electrode by sputtering to form a pixel electrode. It can be seen that the size (area) of the device (TFT) itself can be utilized as a pixel unit in the display device, which can cope with the higher image quality and higher definition of the display device, the pixel itself is transparent and transmits light and the size of the pixel unit can be decreased as far as the limit size of the transistor. Further, it can be seen that since the transparent semiconductor layer has no absorption to the visible light and there is no requirement of separately disposing the light shielding member, manufacturing steps are simple. Further, it can also be seen that bright and less power consuming display device can be obtained since the problem of area ratio (opening ratio) between the TFT portion and the pixel electrode can be overcome.

The transparent semiconductor layer and the transparent insulative layer were formed as below.

A Corning 7059 substrate formed with the transparent gate electrode was placed on the substrate holder 3 and, after evacuating the inside of the film formation chamber 1 by way of the exhaustion port 2, the substrate was heated to 400° C. by the heater 4. An $N_2$ gas was introduced at 2000 sccm from the gas introduction tube 9 into the quartz tube of 25 mm in diameter, the output of the microwaves at 2.45 GHz was set to 250 W by way of the microwave guide tube 8 and discharging was conducted while matching by a tuner. The power of the reflection waves at this stage was 0 V. An $H_2$ gas was introduced at 1000 sccm from the gas introduction tube 10 into the quartz tube 6 of 30 mm in diameter. The output of RF power at 13.56 MHz was set to 100 V. The power of reflection wave was at 0 W. In this state, vapor of trimethyl gallium (TMGa) kept at 0° C. was introduced at 0.3 sccm from the gas introduction tube 12 and then introduced passing through the mass flow controller under bubbling while using hydrogen as a carrier gas. The reaction pressure measured by the Baratron vacuum gage was 66.65 Pa (0.5 Torr). The film formation was conducted for 60 minutes to form an n-type undoped GaN:H film of about 200 nm in thickness to form a transparent semiconductor layer. The hydrogen concentration n the GaN:H film was 5 atomic %.

Further, for the transparent insulative layer, an amorphous AlGaN:H film was formed to 100 nm thickness under the same conditions except for introducing trimethyl aluminum simultaneously and in the same amount as trimethyl gallium (TMGa) and conducting film formation for 90 minutes. The hydrogen concentration in the AlGaN:H film was 15 atomic %.

It was also found that also the stagger type TFT could function in the same manner and the size of the device itself could be utilized as the pixel element in the display device. It was also identical in a case of using an amorphous silicon nitride, or silicon oxide as the transparent insulative layer.

Example 2

When an inverted stagger type TFT device was manufactured in the same manner as in Example 1 except for forming the transparent semiconductor layer as described below, it could be confirmed that 0.3 to 0.7 $\mu A$ of a current could be obtained at gate voltage of 10 V on the gate electrode when voltage of 5 V was applied between the transparent source electrode and the transparent drain electrode in this device, and the device could operate as the transparent inverted stagger type TFT, and it was found that the size of the device itself could be utilized as the pixel unit in the display device.

Formation of Transparent Semiconductor Layer

A transparent semiconductor layer was formed in the same manner as in Example 1 except for mixing biscyclopentadiene magnesium by 1000 ppm in the starting material gas simultaneously with trimethyl gallium.

When an inverted stagger type TFT device was manufactured in the same manner as in Example 1 except for forming the transparent semiconductor layer as described below, it was confirmed that 1.0 $\mu A$ of a current was obtained at gate voltage of 7 V on the gate electrode when voltage of 5V was applied between the transparent source electrode and the transparent drain electrode and the device operated as a transparent inverted stagger type TFT, and it was also found that the size of the device itself could be utilized as the pixel unit in the display device.

Formation of Transparent Semiconductor Layer

At first, a magnesium doped GaN:H film (transparent semiconductor layer) was formed to 100 nm in thickness in the same manner as in Example 1 except for mixing bicyclopentadienyl magnesium at a material ratio of 1% with the starting material gas simultaneously with trimethyl gallium and further, a silicon doped GaN(H) film (transparent semiconductor layer) was formed to 100 nm in thickness in the same manner as in Example 1 except for mixing silane at a material ratio of 1% to the starting material gas together with trimethyl gallium, to form a transparent semiconductor layer of a 2-layered structure.

As has been described above, this invention can provide a thin film transistor capable of obtaining a display device which is transparent and capable of transmitting light, with fewer light untransmissive portions in the pixel unit, capable of reducing the size of the pixel unit to the limit size of the transistor, manufactured by simple manufacturing steps, bright and with less power consumption.

The entire disclosure of Japanese Patent Application No. 2001-379779 filed on Dec. 13, 2001 including specification, claims, drawings and abstract is incorporated herein by reference in its entirety.

What is claimed is:

1. A thin film transistor comprising, on a transparent substrate:

a transparent semiconductor layer containing nitrogen, hydrogen and one or more elements selected from Al, Ga and In;

a transparent source electrode and a transparent drain electrode at least partially in contact with the transparent semiconductor layer; and a transparent gate electrode.

2. The thin film transistor according to claim 1, comprising a transparent pixel electrode disposed through an arbitrary layer and/or electrode on the gate electrode.

3. The thin film transistor according to claim 2, wherein the transparent pixel electrode substantially covers the transparent semiconductor layer, the source electrode, and the drain electrode.

4. The thin film transistor according to claim 1, wherein the transparent semiconductor layer further contains one or more elements selected from Be, Mg, Ca, C, Si, Ge and Pb.

5. The thin film transistor according to claim 1. wherein the transparent semiconductor layer further contains one or more elements selected from C, Si, Ge and Pb in a region in contact with the transparent source electrode and the transparent drain electrode.

6. The thin film transistor according to claim 1, wherein a transparent insulative layer is disposed between the transparent gate electrode and the transparent semiconductor layer, and the transparent insulative layer comprises amorphous silicon nitride.

7. The thin film transistor according to claim 1, wherein a transparent insulative layer is disposed between the transparent gate electrode and the transparent semiconductor layer, and the transparent insulative layer comprises silicon oxide.

8. A thin film transistor comprising, on a transparent substrate:

a transparent semiconductor layer containing nitrogen, hydrogen and one or more elements selected from Al, Ga and In;

a transparent source electrode and a transparent drain electrode at least partially in contact with the transparent semiconductor layer; and a transparent gate electrode;

wherein a transparent insulative layer is disposed between the transparent gate electrode and the transparent semiconductor layer, and the transparent insulative layer is a semiconductor layer containing nitrogen, 0.5 atomic % or more and 50 atomic % or less of hydrogen and one or more elements selected from Al, Ga and In.

9. A display device comprising a thin film transistor having, on a transparent substrate, a transparent semiconductor layer containing nitrogen, hydrogen and one or more elements selected from Al, Ga and In, a transparent source electrode and a transparent drain electrode at least partially in contact with the transparent semiconductor layer, and a transparent gate electrode.

* * * * *